US011599132B2

(12) United States Patent
Wu et al.

(10) Patent No.: US 11,599,132 B2
(45) Date of Patent: Mar. 7, 2023

(54) METHOD AND APPARATUS FOR REDUCING POWER-UP OVERSTRESS OF CAPACITOR-LESS REGULATING CIRCUITS

(71) Applicant: Nuvoton Technology Corporation, Taiwan (CN)

(72) Inventors: Chang-Xian Wu, San Jose, CA (US); Bal S. Sandhu, Fremont, CA (US)

(73) Assignee: Nuvoton Technology Corporation, Hsinchu (TW)

( * ) Notice: Subject to any disclaimer, the term of this patent is extended or adjusted under 35 U.S.C. 154(b) by 162 days.

(21) Appl. No.: 17/186,021

(22) Filed: Feb. 26, 2021

(65) Prior Publication Data
US 2022/0276666 A1  Sep. 1, 2022

(51) Int. Cl.
| G05F 1/571 | (2006.01) |
| H03F 1/02 | (2006.01) |
| G05F 3/26 | (2006.01) |
| G05F 1/575 | (2006.01) |

(52) U.S. Cl.
CPC .............. *G05F 1/571* (2013.01); *G05F 1/575* (2013.01); *G05F 3/262* (2013.01); *H03F 1/0233* (2013.01)

(58) Field of Classification Search
CPC .......... G05F 1/462; G05F 1/465; G05F 1/468; G05F 1/56; G05F 1/575; G05F 1/562; G05F 1/565; G05F 1/567; G05F 1/569; G05F 1/571; G05F 1/573; G05F 1/5735; G01R 19/165; G01R 19/16504; G01R 19/16509; G01R 19/16514; G01R 19/16519; G01R 19/16523; G01R 19/16528; G01R 19/16533; G01R 19/16538; G01R 19/16542; G01R 19/16547; G01R 19/16552; G01R 19/16557; G01R 19/16561; G01R 19/16566; G01R 19/16571; G01R 19/16576; G01R 19/1658; G01R 19/16585; G01R 19/1659; G01R 19/16595; G01R 19/17
See application file for complete search history.

(56) References Cited

U.S. PATENT DOCUMENTS

| 7,199,565 B1* | 4/2007 | Demolli | G05F 1/575 |
| | | | 323/273 |
| 9,791,874 B1* | 10/2017 | Wang | G05F 1/575 |
| 9,874,889 B1* | 1/2018 | Zhao | G05F 1/575 |
| 10,545,523 B1* | 1/2020 | Wu | G05F 1/565 |
| 10,996,700 B1* | 5/2021 | Tan | G05F 1/575 |
| 2006/0164053 A1* | 7/2006 | Walter | G05F 1/575 |
| | | | 323/282 |
| 2011/0181257 A1* | 7/2011 | Pancholi | G05F 1/575 |
| | | | 323/280 |
| 2011/0248693 A1* | 10/2011 | Karnik | G05F 1/575 |
| | | | 323/280 |

(Continued)

*Primary Examiner* — Thienvu V Tran
*Assistant Examiner* — Nusrat Quddus
(74) *Attorney, Agent, or Firm* — Kilpatrick Townsend & Stockton LLP (57) ABSTRACT

An amplifier circuit includes an amplifier and an output transistor. The amplifier is coupled to an output node of the output transistor for providing an output voltage to a load device. The amplifier circuit also includes a slew-rate control circuit coupled to a gate node of the output transistor and configured to control voltage rise of the gate node of the output transistor during power-up to reduce output voltage overshoot.

10 Claims, 9 Drawing Sheets

(56) References Cited

U.S. PATENT DOCUMENTS

| | | | |
|---|---|---|---|
| 2015/0378377 A1* | 12/2015 | Kronmueller | H03F 3/3027 |
| | | | 323/281 |
| 2016/0349777 A1* | 12/2016 | Caracciolo | G05F 1/575 |
| 2019/0324485 A1* | 10/2019 | Hsu | G05F 1/565 |
| 2020/0125126 A1* | 4/2020 | Gupta | G05F 1/59 |
| 2020/0326737 A1* | 10/2020 | Inoue | H03K 17/0822 |

* cited by examiner

METHOD AND APPARATUS FOR REDUCING POWER-UP OVERSTRESS OF CAPACITOR-LESS REGULATING CIRCUITS

BACKGROUND OF THE INVENTION

The invention relates to the field of electronic circuits. More particularly, embodiments of the present invention are directed to capacitor-less linear regulating circuits. Some embodiments described herein are applied to reducing power-up overstress in capacitor-less regulator circuits. However, the circuit and methods described herein can be used in applications which involve reducing power-up overstress in other amplifier circuit.

The linear regulator acts as a variable resistor between the input power source and the output to drop the voltage applied to the load. As a result, the efficiency of a linear regulator is low. Unlike a switching power supply DC-DC converter, the linear regulators provide continuous operation and are cheaper and easier to use.

Figure 1:
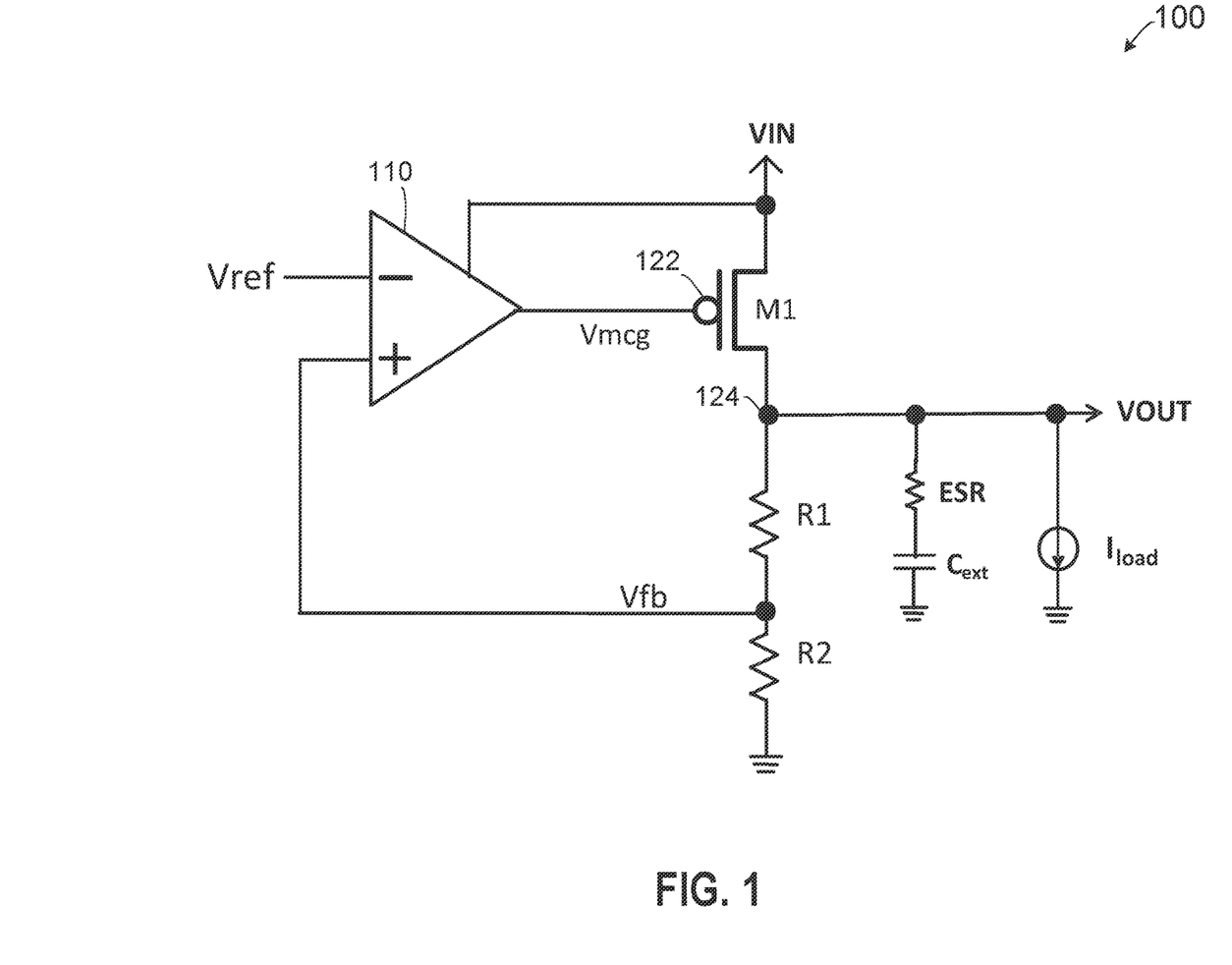
FIG. 1 is a simplified schematic diagram for a conventional linear regulating circuit.

FIG. 1 is a simplified schematic diagram for a conventional linear regulating circuit. As shown in FIG. 1, linear regulator 100 is a low drop-out regulator (LDO) that takes in an input power source VIN, and produces a regulated output voltage, VOUT. A low-dropout or LDO regulator is a DC linear voltage regulator which can regulate the output voltage. LDO 100 includes an amplifier 110, which is a differential amplifier as an error amplifier, and an output transistor M1, which can be a power FET (field effect transistor). Differential amplifier 110 is configured to amplify a differential between a reference voltage Vref and a feedback voltage Vfb, which is a portion of a regulated output voltage Vout sampled by a voltage divider formed by resistors R1 and R2. An output of the differential amplifier 110 is coupled to a gate node 122 of output transistor M1. The regulated output voltage Vout is derived at an output node 124 of output transistor M1. The gate voltage at gate node 122 is designated as Vg in FIG. 1. FIG. 1 also shows input voltage VIN providing operational power to LDO 100. A load device, represented by a current sink $I_{load}$ receives power provided by LDO 100.

For an ideal operational amplifier (OP amp) gain, the output voltage is given by, $$V_{OUT} = V_{REF} = V_o = \left(1 + \frac{R_1}{R_2}\right)V_{REF}$$

where VREF is a reference voltage, which can be a bandgap reference voltage of, e.g., 1.205V.

The conventional compensated linear voltage regulator (LDO) of FIG. 1 requires a relatively large external capacitor, $C_{ext}$, typically in the micro-farad range to control the stability. In this case, the integrated circuit chip requires a pin to connect to the external capacitor $C_{ext}$, which increases the board cost and area. In FIG. 1, an equivalent series resistance (ESR) is shown in series with the external capacitor, $C_{ext}$. To circumvent the issue of having an extra pin on the chip and employing an external low ESR capacitor, a capacitor-less linear regulator is employed, but presents challenges for load stability and transient response.

Therefore, improved methods and systems that address some of the limitations described above are desired.

BRIEF SUMMARY OF THE INVENTION

According to some embodiments of the invention, circuit sand methods are provided to reduce the overstress of amplifier circuits during power-up. In some embodiments, a current source is coupled to the gate noted of an output transistor to control the slew rate of the rise of the gate current to prevent spiking in the output voltage. A detection circuit monitors the output voltage and turns off the slew rate control for the normal operation of the amplifier circuits.

According to some embodiments of the present invention, an amplifier circuit includes a linear regulator having an amplifier and an output transistor forming a feedback loop. The amplifier is configured for receiving a reference voltage and a feedback voltage from the feedback loop, and the output transistor having an output node for providing an output voltage to a load device. The amplifier circuit also includes a slew-rate control circuit coupled to a gate node of the output transistor and configured to control voltage rise of the gate node during power-up to reduce output voltage overshoot.

In some embodiments, the amplifier circuit is configured to disable the slew control circuit when the output voltage reaches a pre-set voltage level.

In some embodiments, the slew-rate control circuit includes a switch transistor and a diode-connected transistor, the gate node of the diode-connected transistor coupled to the gate node of the output transistor to form a current mirror, the diode-connected transistor having its gate node coupled to its drain node.

In some embodiments, the diode-connected transistor and the switch transistor are p-type metal-oxide-semiconductor (PMOS) transistors.

In some embodiments, the slew rate is determined by a bias current in the diode-connected transistor and the size of the diode-connected transistor.

In some embodiments, the amplifier circuit also includes an output voltage level detection circuit coupled to the output node of the output transistor. The output voltage level detection circuit is configured to turn off the switch transistor to disable the slew control circuit if the output voltage reaches a pre-set voltage level.

In some embodiments, the output voltage level detection circuit includes a first current source, a first transistor, and a bias resistor coupled in series between a voltage supply and a ground node, a gate node of the first transistor coupled to the output node of the output transistor. The output voltage level detection circuit also includes a second transistor coupled between a source node of the first transistor and the ground node, and a third transistor having a gate node coupled to a drain node of the first transistor and a drain node coupled to the second transistor and a gate node of the switch transistor of the slew rate control circuit.

In some embodiments, the output voltage level detection circuit is configured to disable the slew rate control circuit if the output voltage reaches the pre-set voltage level, wherein the pre-set voltage level is determined based on the first current source, the bias resistor, and a threshold voltage of the first transistor.

In some embodiments, the first transistor, the second transistor, and the third transistor are n-type metal-oxide-semiconductor (NMOS) transistors.

In some embodiments, the amplifier circuit also includes an amplifier bias current selection circuit configured to select a first bias current for the amplifier during power-up, and a second bias current for the amplifier during normal operation, wherein the first bias current is greater than the second bias current.

According to some embodiments of the present invention, an amplifier circuit includes an amplifier and an output transistor. The amplifier is coupled to an output node of the output transistor for providing an output voltage to a load device. The amplifier circuit also includes a slew-rate control circuit coupled to a gate node of the output transistor and configured to control voltage rise of the gate node of the output transistor during power-up to reduce output voltage overshoot.

In some embodiments, the amplifier circuit also includes an output voltage level detection circuit configured to disable the slew control circuit when the output voltage reaches a pre-set voltage level.

In some embodiments, the slew-rate control circuit includes a switch transistor and a diode-connected transistor. The gate node of the diode-connected transistor is coupled to the gate node of the output transistor to form a current mirror, the diode-connected transistor having its gate node coupled to its drain node.

In some embodiments, the output voltage level detection circuit is coupled to the output node of the output transistor, the output voltage level detection circuit configured to turn off the switch transistor to disable the slew control circuit if the output voltage reaches the pre-set voltage level.

In some embodiments, the output voltage level detection circuit includes a first current source, a first transistor, and a bias resistor couple in series between a voltage supply and a ground node, with a gate node of the first transistor coupled to the output node of the output transistor. The output voltage level detection circuit also includes a second transistor coupled between a source node of the first transistor and the ground node, and a third transistor having a gate node coupled to a drain node of the first transistor and a drain node coupled to the second transistor and a gate of the switch transistor of the slew rate control circuit.

According to some embodiments of the present invention, a method for reducing output voltage overshoot in an amplifier circuit is provided. The amplifier circuit includes an amplifier and an output transistor, with the amplifier coupled to an output node of the output transistor for providing an output voltage to a load device. The method includes controlling voltage rise of a gate node of the output transistor by coupling a slew-rate control circuit to the gate node during power-up to reduce output voltage overshoot.

In some embodiments, the method also includes disabling the slew-rate control circuit if the output voltage reaches a pre-set voltage level.

In some embodiments, the method also includes using a slew-rate control circuit that includes a diode-connected transistor in series with a switch transistor, the diode-connected transistor forming a current mirror with the output transistor.

In some embodiments, the method also includes turning off the switch transistor if the output voltage reaches the pre-set voltage level.

In some embodiments, the method also includes selecting a first bias current for the amplifier during power-up, and selecting a second bias current for the amplifier during normal operation. The first bias current is greater than the second bias current.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a second label that distinguishes among the similar components. If only the first reference label is used in the specification, the description can be applicable to any one of the similar components having the same first reference label irrespective of the second reference label.

DETAILED DESCRIPTION OF THE INVENTION

Aspects of the disclosure are described more fully hereinafter with reference to the accompanying drawings, which form a part hereof, and which show, by way of illustration, example features. The features can, however, be embodied in many different forms and should not be construed as limited to the combinations set forth herein; rather, these combinations are provided so that this disclosure will be thorough and complete, and will convey the scope. Among other things, the features of the disclosure can be facilitated by methods, devices, and/or embodied in articles of commerce. The following detailed description is, therefore, not to be taken in a limiting sense.

Figure 2A:
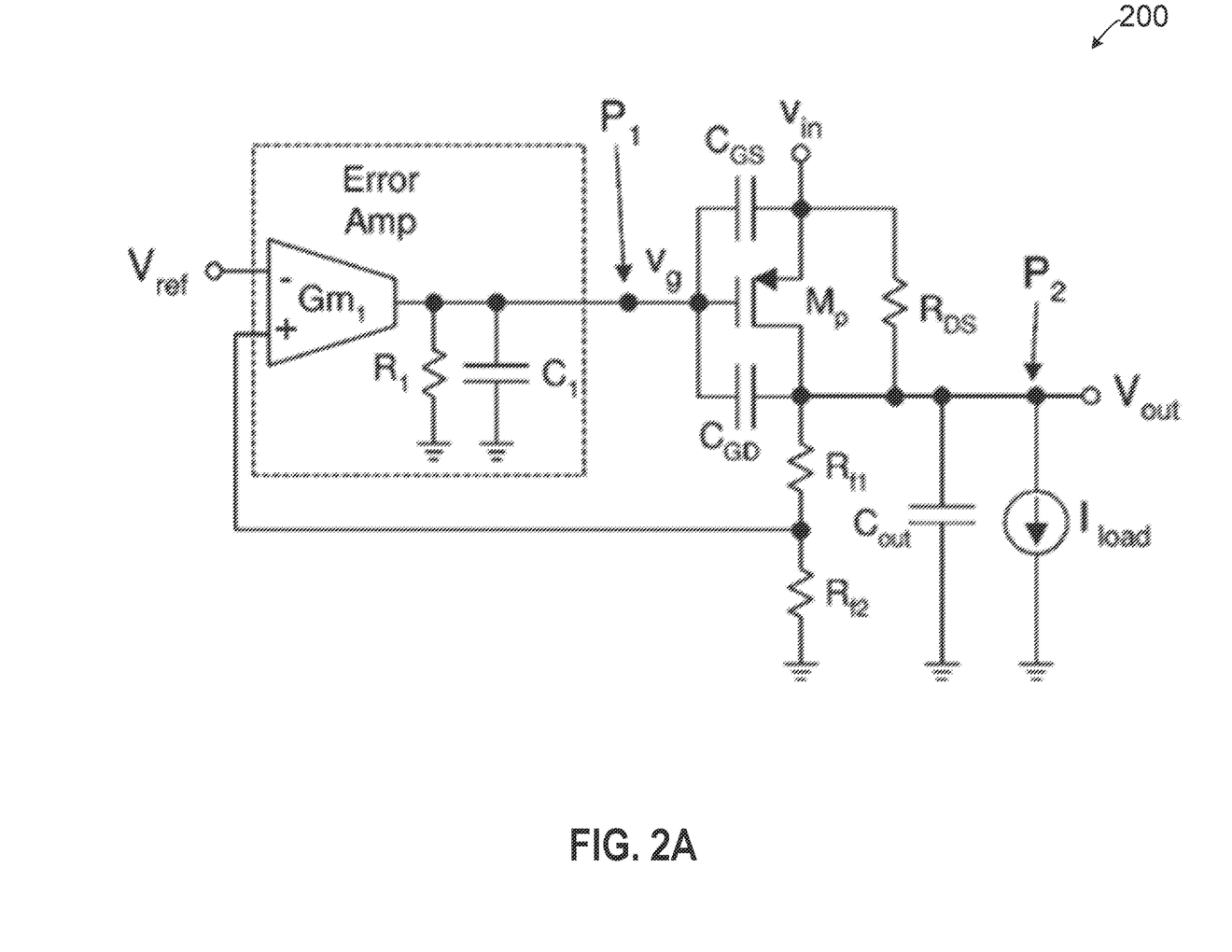
FIG. 2A is a schematic diagram illustrating an equivalent circuit of a capacitor-less linear regulating circuit.
Figure 2B:
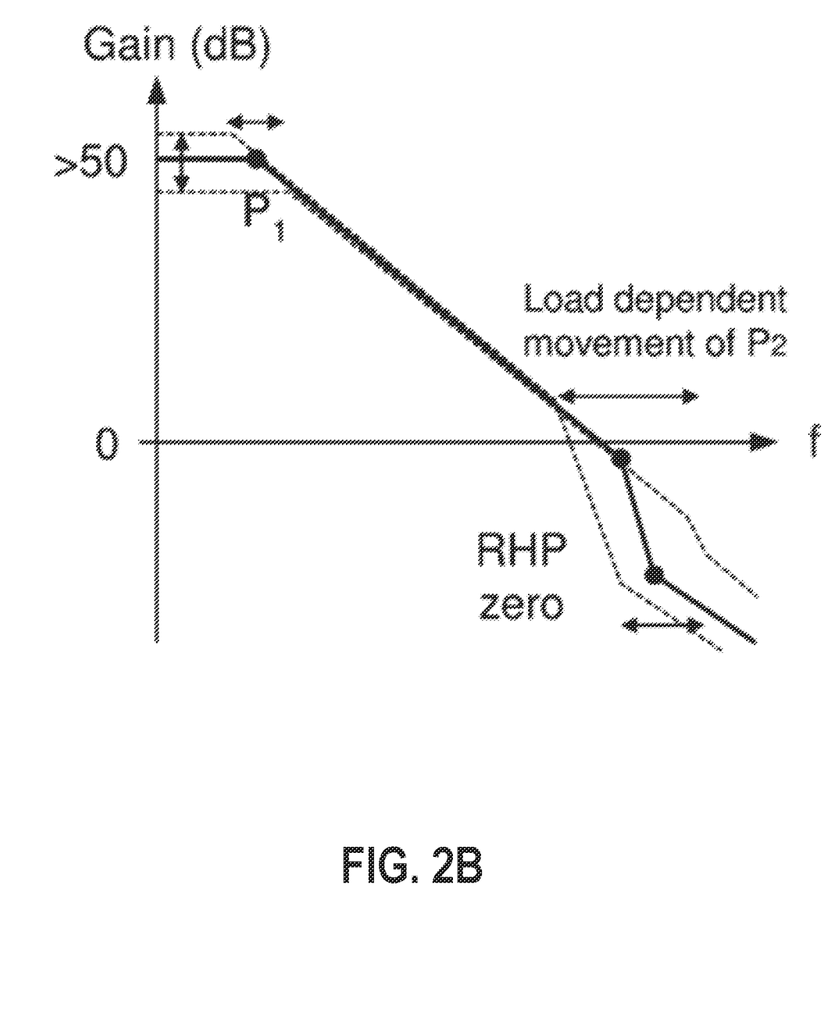
FIG. 2B is a gain vs frequency plot illustrating the pole locations of the linear regulator of FIG. 2A.

FIG. 2A is a schematic diagram illustrating an equivalent circuit of a capacitor-less linear regulating circuit, and FIG. 2B is a gain vs frequency plot illustrating the pole locations of the linear regulator of FIG. 2A. As shown in FIG. 2A, linear regulator 200 receives an input power source VIN, and produces a regulated output voltage, VOUT. Linear regulator 200 includes an error amplifier, labeled Error Amp, with a gain of $Gm_1$ and internal resistor $R_1$ and capacitor C1. Linear regulator 200 also includes an output transistor Mp, also referred to as a pass transistor, and a feedback loop formed by a midpoint of a voltage divider of resistors $R_{11}$ and $R_{12}$ to an input node of Error Amp. Output transistor Mp has associated parasitic capacitors $C_{GS}$ and $C_{GS}$, as well as a parasitic resistor $R_{DS}$. An external load device is represented by a current Load.

Linear regulator 200 is an uncompensated capacitor-less regulator, which has two major poles, as shown in FIG. 2B. The first pole is the error amplifier output pole, $P_1$, and the second pole is the load dependent output pole, $P_2$. The dominant pole, $P_1$, is given by:

$$P_1 = \frac{1}{R_1 \cdot (C_1 + C_{GS} + A_{pass} \cdot C_{GD})}$$

where, $A_{pass}$ is the voltage gain of the pass transistor Mp. Thus, the pole $P_1$ resides at low frequency, typically several kHz, since the output resistance of the error amplifier is relatively large enough to have enough DC loop gain.

The second pole, $P_2$ is located at the output, Vout, and can be given by:

$$P_2 = \frac{1}{R_{DS}\|(R_{f1}+R_{f1})\|R_{out}\|\left(\left(\frac{C_{GD}}{C_1+C_{GS}+C_{GD}}\right)\cdot\frac{1}{G_{mP}}\right)|C_{out}}$$

where $G_{mp}$ is the trans-conductance gain of the output transistor Mp, Rout is the equivalent resistance due to the current loading effects, and Cout is an on-chip load capacitance and is typically <100 pF due to chip area constraints.

The transconductance $G_{mp}$ and resistance $R_{DS}$ of the pass transistor can change with increasing load current, making it sensitive to the load condition. Large load currents can push $P_2$ to higher frequencies well past pole $P_1$. At low currents, the effective load resistance increases significantly, and $P_2$ can be pushed to lower frequencies. With the variation in pole locations, the loop stability cannot be guaranteed. In addition, the side effect of $C_{GD}$, is the generation of a right-hand plane (RHP) zero that reduces loop phase margin. Hence, more care has to be taken in the design of a capacitor-less regulator circuit to ensure loop stability.

Figure 3A:
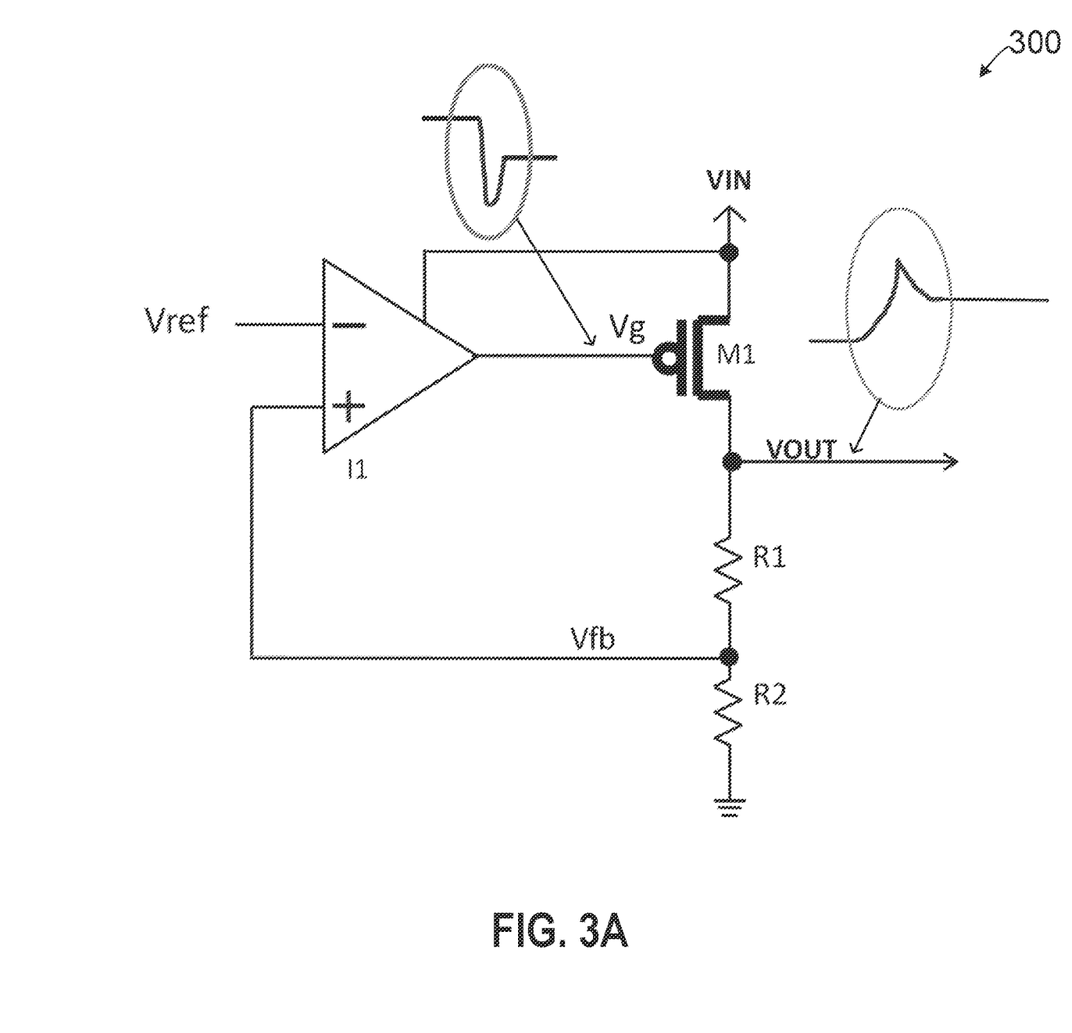
FIG. 3A is a simplified schematic diagram for a linear regulating circuit with waveforms showing the output response during power-up according to some embodiments of the present invention.

FIG. 3A is a simplified schematic diagram for a linear regulating circuit with waveforms showing the output response during power-up according to some embodiments of the present invention. The components of linear regulator 300 are similar to those illustrated in FIG. 1 and, therefore, are not described in detail here.

As explained above, the problem with a capacitor-less regulator, where no external capacitor is used, the stability is more challenging. Hence, we trade the speed of the feedback response with achieving an adequate phase margin. As a result, when the chip is powered-on, it takes some time to bring the error amplifier from cut-off region into linear operation before it starts controlling the gate voltage, Vg, on transistor M1. This output pass transistor is very large, and a glitch on the gate of M1, shown by waveform 310 in FIG. 3B, during this power-up state can cause the full rail voltage VIN (e.g., 3.6V) to appear on the output Vout, as shown by waveform 320. This can be problematic when the regulator is designed to drive 1.8V logic circuits. If the output voltage exceeds 1.8V+200 mV, the 1.8V logic circuit will receive an over-voltage stress on the gate-oxide of its transistors. As a result, the performance of the circuit will degrade over time.

Figure 3B:
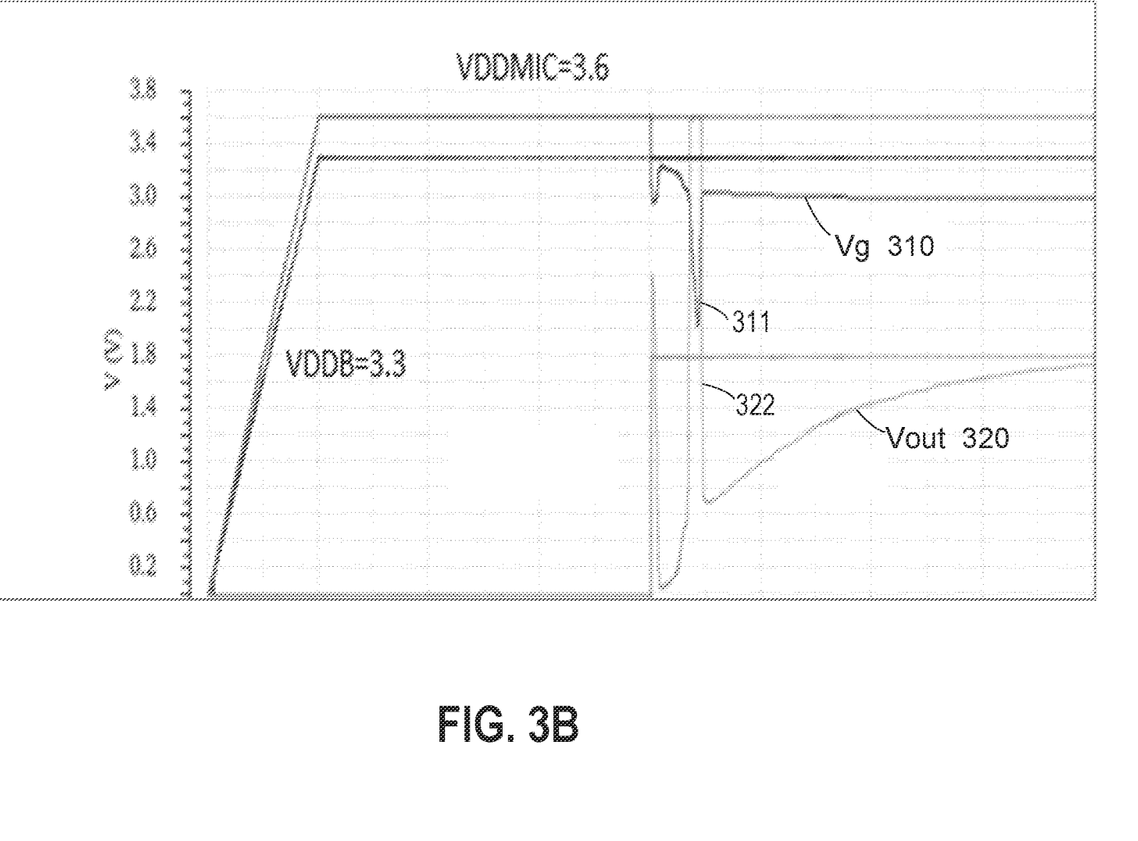
FIG. 3B shows simulation waveforms illustrating the behavior of the gate voltage on output transistor MP and output voltage of the liner regulator of FIG. 3A during chip power-up according to some embodiments of the present invention.

FIG. 3B shows simulation waveforms illustrating the behavior of the gate voltage Vg on output transistor MP during chip power-up. FIG. 3B shows supply voltages VDDMIC and VDDB ramping up to 3.6V and 3.3V, respectively. FIG. 3B further shows output transistor gate voltage Vg 310 and output voltage Vout 320 for a conventional capacitor-less regulator circuit without slew-rate (SR) control. In this case, there is a negative glitch 311 on the gate voltage Vg of the output transistor MP, which results in the glitch 322 in the output voltage Vout to full rail (3.6V).

In some embodiments of the present invention, an amplifier circuit can include a feedback circuit which is added to an amplifier to address the problem of power-up glitches. The amplifier circuit can include an amplifier and an output transistor. The amplifier is coupled to an output node of the output transistor for providing an output voltage to a load device. The amplifier circuit also includes a slew-rate control circuit coupled to a gate node of the output transistor and configured to control voltage rise of the gate node of the output transistor during power-up to reduce output voltage overshoot or glitch.

The slew rate is often defined as the rate of change of a waveform, which is the same as the slope. As used herein, the term "slew-rate control circuit" refers to a circuit that controls the rate of voltage rise of a circuit node. An example is illustrated using a linear regulator in FIG. 4 below.

Figure 4:
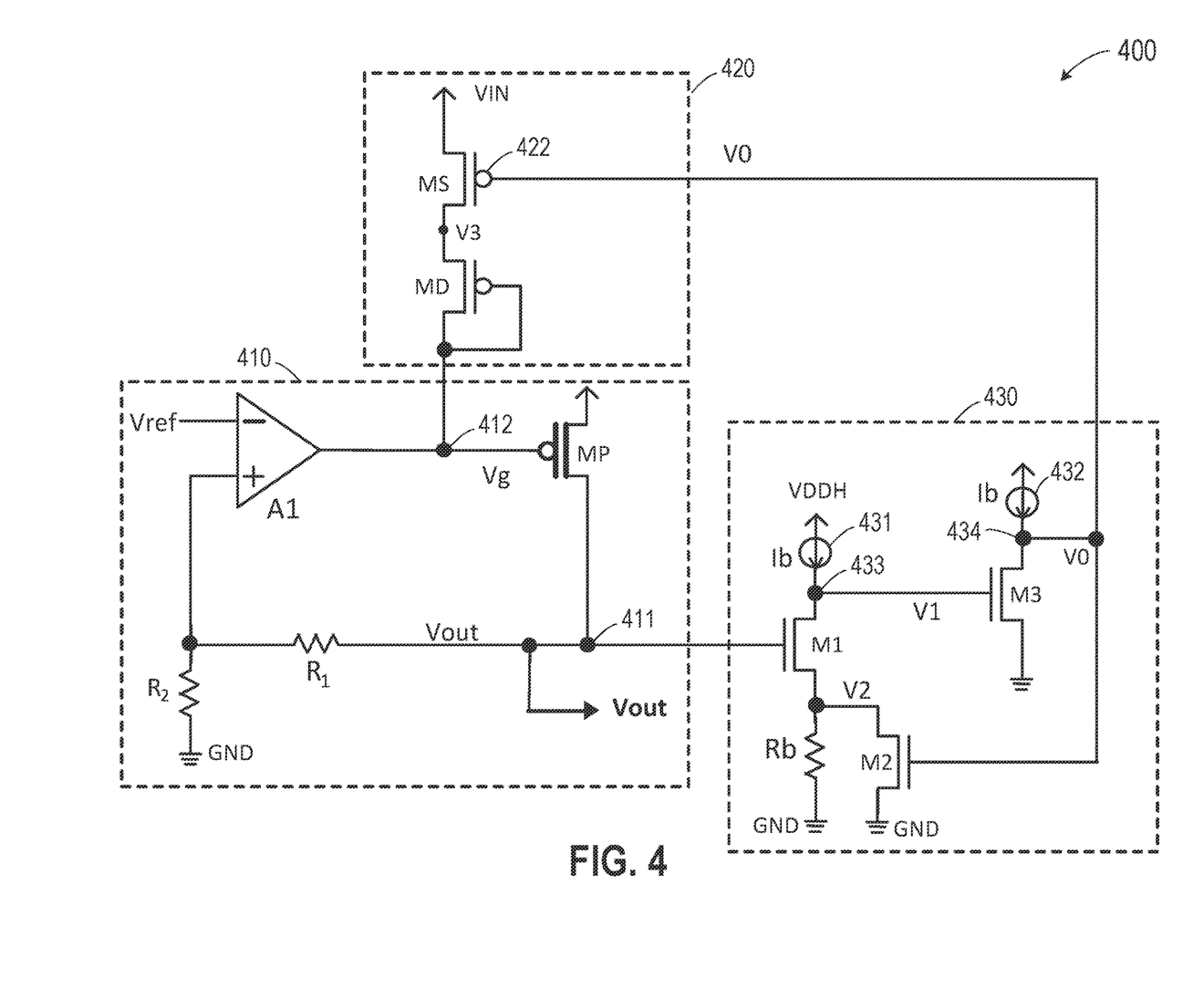
FIG. 4 is a schematic diagram illustrating a linear regulator circuit according to some embodiments of the present invention.

FIG. 4 is a schematic diagram illustrating a linear regulator circuit according to some embodiments of the present invention. As shown in FIG. 4, an amplifier circuit 400 includes a linear regulator 410 having an amplifier A1 and an output transistor MP forming a feedback loop with a feedback resistor divider formed by resistors R1 and R2. The amplifier A1 is configured for receiving a reference voltage Vref and a feedback voltage Vfb from the feedback loop. The output transistor MP has an output node 411 for providing an output voltage Vout to a load device, which is not shown in FIG. 4. Amplifier circuit 400 also includes a slew-rate control circuit 420 coupled to a gate node 412 of the output transistor MP and configured to control the voltage rise of the gate node 412 during power-up to reduce output voltage overshoot.

The slew-rate control circuit 420 includes a switch transistor MS and a diode-connected transistor MD coupled in series between a supply voltage VIN and the gate node 412 of the output transistor MP. The gate node of the diode-connected transistor MD is coupled to the gate node 412 of the output transistor MP to form a current mirror. The diode-connected transistor MD has its gate node coupled to its drain node, both of which are connected to the gate node 412 of the output transistor MP. Supply voltage VIN is a power supply voltage derived from an external power supply and used as a power supply for the circuit of the amplifier. In this example, the diode-connected transistor MD and the switch transistor MS are p-type metal-oxide-semiconductor (PMOS) transistors.

In some embodiments, the slew rate is determined by a bias current in the diode-connected transistor and the size of the diode-connected transistor. In this case, the current mirror formed by transistors MD and MP can represent a current source. The current in transistor MP can be varied by changing the size of the diode-connected transistor.

The amplifier circuit 400 is configured to disable the slew control circuit when the output voltage reaches a pre-set voltage level. In the example of FIG. 4, the amplifier circuit 400 also includes an output voltage level detection circuit 430 coupled to the output node 411 of the output transistor MP. The output voltage level detection circuit 430 is configured to turn off the switch transistor MS to disable the slew control circuit 420, if the output voltage reaches the pre-set voltage level.

In the example of FIG. 4, the output voltage level detection circuit 430 includes a first current source 431, a first transistor M2, and a bias resistor Rb coupled in series between the source of transistor M1 and a ground node GND. A gate node of the first transistor M1 coupled to the output node 411 of the output transistor MP. A second transistor M2 is coupled between a source node of the first transistor M1 and the ground node GND. The second transistor M2 functions as a shunt path for the first transistor M2. A third transistor M3 is coupled to a second current source 432. Transistor M3 has a gate node 433 coupled to a drain node of the first transistor M1 and a drain node 434 coupled to the second transistor M2. The drain node 434 of the third transistor M3 is also coupled to a gate node 422 of the switch transistor MS of the slew rate control circuit 420.

The output voltage level detection circuit 430 is configured to disable the slew rate control circuit 420 if the output voltage Vout reaches the pre-set voltage level. The pre-set voltage level is determined based on the bias current Ib of the first current source, the resistance of the bias resistor Rb, and the threshold voltage of the first transistor M2. In the example of FIG. 4, the first transistor M2, the second transistor M2, and the third transistor M3 are n-type metal-oxide-semiconductor (NMOS) transistors.

As shown in FIG. 4, amplifier circuit 400 is a linear regulator. Amplifier circuit 400 can be configured as a low dropout (LDO) regulator if an input voltage VIN is coupled to the output transistor MP, as shown in the examples of FIGS. 1-3.

In FIG. 4, amplifier A1 can be an error amplifier coupled between a power supply and the ground terminal. As an example, the error amplifier can be a differential amplifier, configured to provide the gate voltage based on a differential between the reference voltage and the regulated output voltage. The differential amplifier can include a pair of input transistors, a pair of bias transistors, and a pair of current mirror transistors. The output transistor MP includes a gate node coupled to an output node of the differential amplifier to receive a gate voltage and to provide a regulated output voltage at an output node of the output transistor.

The operation of amplifier circuit 400, operating as a linear regulator, is explained as follows. Initially, all node voltages are zero. As the power is turned-on, the supply voltage VIN starts ramping up. The voltage V1 on the drain node 433 of the first transistor M1 in the output voltage level detection circuit 430 also ramps up and is set by the bias current, Ib on the drain of transistor M2. Since V1 is ramping up and is connected to the gate of transistor M3, the voltage V0 on the drain of transistor M3 remains low. With voltage V0 remaining low, the slew rate control circuit 420 is enabled by switch transistor MS being ON. This allows the source voltage V3 to pass to the drain of transistor MD, which is coupled to 412, the gate node of transistor MP. Now, transistor MD, in conjunction with transistor MP, acts as a current mirror, thereby limiting and controlling the current through the large pass transistor MP. In addition, transistor MD acts as a clamp to limit the voltage on the gate node 412 of MP to VIN−Vthp, where Vthp is the threshold voltage of PMOS transistor MD. This allows the regulator circuit to smoothly bring up the voltage Vout, without causing a glitch on the gate node of transistor M1.

If the output voltage Vout at node 411, which is the gate node of transistor M1, reaches a pre-set voltage level Vt+IR, transistor M1 is turned on. Here, Vt is the threshold voltage of transistor M1, I is bias current Ib of the first current source 431, and R is the resistance value of bias resistor Rb. When transistor M1 is turned on, the voltage V1 at node 433 goes low, turning off transistor M3. The voltage V0 at the drain node 434 of transistor M3 goes high, turning off switch transistor MS to disable the slew-rate control circuit 420. At the same time, transistor M2 is turned on, pulling the source voltage V2 of transistor M1 to ground. In the meantime, the feedback loop starts to track the output voltage Vout, and the error amplifier A1 enters the linear region.

The amplifier circuit described above can also include an amplifier bias current selection circuit configured to select a first bias current for the amplifier during power-up, and a second bias current for the amplifier during normal operation, wherein the first bias current is greater than the second bias current.

Figure 5:
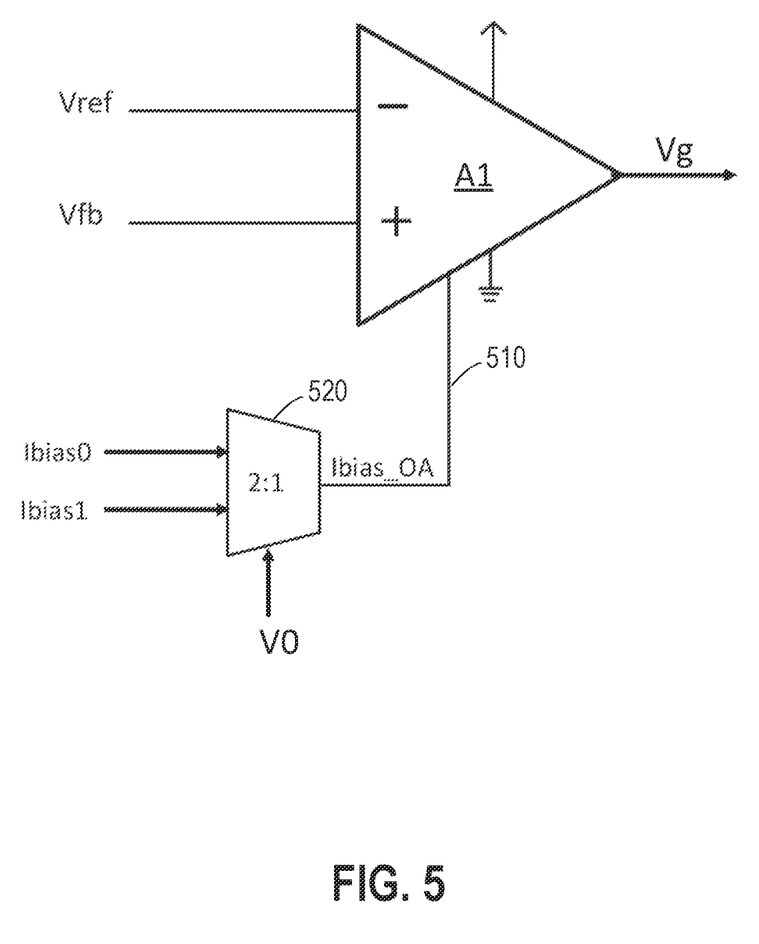
FIG. 5 is a simplified schematic diagram illustrating an amplifier bias current selection according to some embodiments of the present invention.

FIG. 5 is a simplified schematic diagram illustrating an amplifier with an amplifier bias current selection according to some embodiments of the present invention. As shown in FIG. 5, amplifier A1 is similar to amplifier A1 in FIG. 4, and can be used in a linear regulator such as amplifier circuit 410 of FIG. 4. Amplifier A1 is configured to receive a bias current 510. FIG. 5 also shows an amplifier bias current selection circuit 520, which, in this example, is a 2:1 multiplexer circuit with two inputs, ibias0 and ibias 1, and a selection signal V0. V0 is the signal that is used to turn off the slew-rate control circuit 420 in FIG. 2.

During the power-up phase of the circuit, the control signal voltage V0 is also used as a select input for the 2:1 mux. When V0=0, the bias current for the amplifier A1 can be selected to be ibias1, where ibias 1>ibias0. The ibias0 is the normal operating bias current for amplifier A1. With the higher bias current ibias1 during the power-up phase, the amplifier A1 can respond faster to changes in the feed-back loop and track the output voltage.

Figure 6:
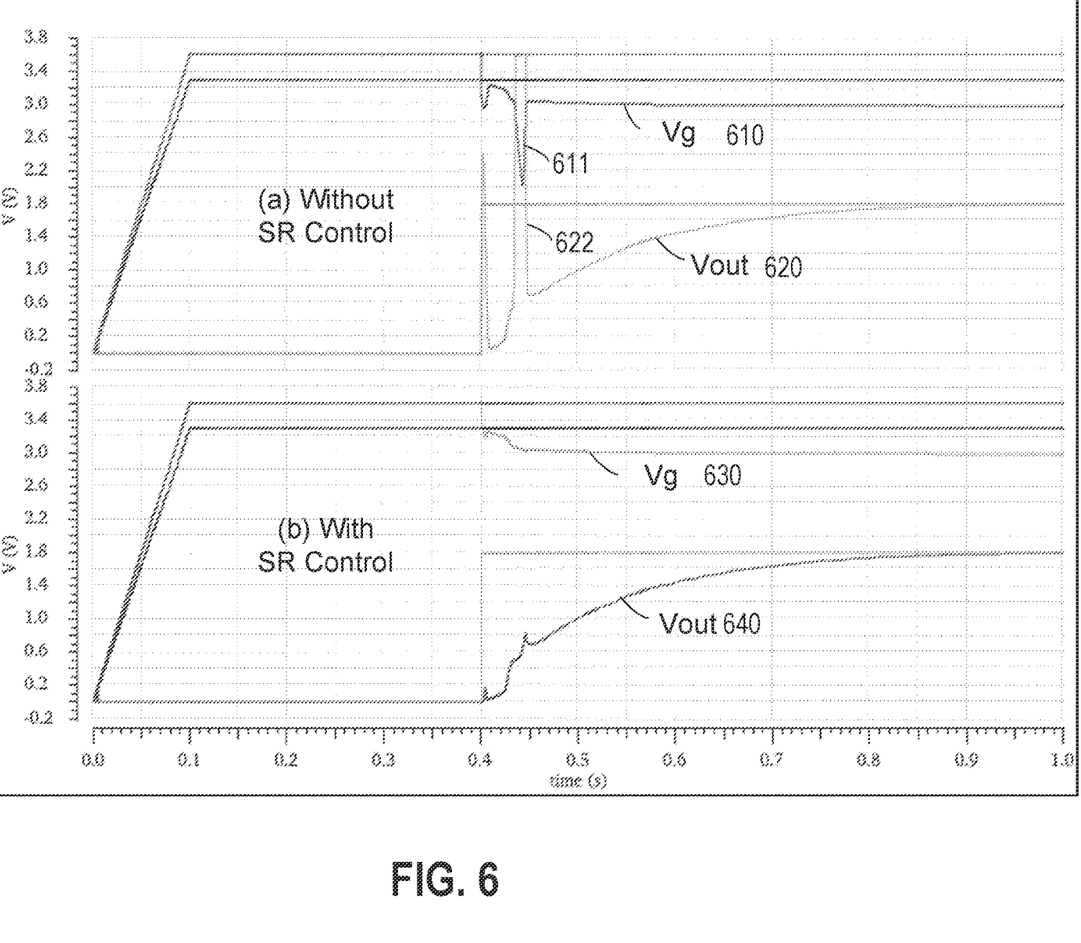
FIG. 6 are waveform diagrams illustrating the amplifier operation during power-up according to some embodiments of the present invention.

FIG. 6 are waveform diagrams illustrating the amplifier operation during power-up according to some embodiments of the present invention. FIG. 6 shows simulation waveforms illustrating the behavior of the gate voltage Vg on output transistor MP during chip power-up. The upper plot shows output transistor gate voltage Vg 610 and output voltage Vout 620 for a conventional capacitor-less regulator circuit without slew-rate (SR) control. In this case, there is a negative glitch 611 on the gate voltage Vg 610 of the output transistor MP, which results in the glitch 622 in the output voltage Vout 620 to full rail (3.6V). The lower plot shows output transistor gate voltage Vg 630 and output voltage Vout 640 for a capacitor-less regulator circuit with the slew-rate (SR) control, as described above. The slew rate and threshold level control prevents glitches. Hence, the circuit described above allows an amplifier, such as a regulator, to smoothly bring up the voltage on the output transistor to the correct level without over-shooting.

In the amplifier circuit embodiments described above, for example, amplifier circuit 400 in FIG. 4, the slew-rate of the gate voltage Vg (412) of the output transistor MP during power up can be changed by changing the area ratios of the diode-connected transistor MS and the output transistor MP. The pre-set voltage level for turning off the slew-rate control circuit 420 can be adjusted by changing the resistance of resistor Rb coupled in series with transistor M1 in output voltage detection circuit 430. Further, as described above in connection to FIG. 5, a first bias current ibias0 can be selected as the bias current for the amplifier A1 during power-up, and a second bias current ibias1 can be selected as the bias current for the amplifier A1 during normal operation. The first bias current ibias0 is lower than the second bias current ibias1. By selecting the higher second bias current ibias1, the amplifier can respond faster to changes in the feed-back loop and track the output voltage.

Figure 7:
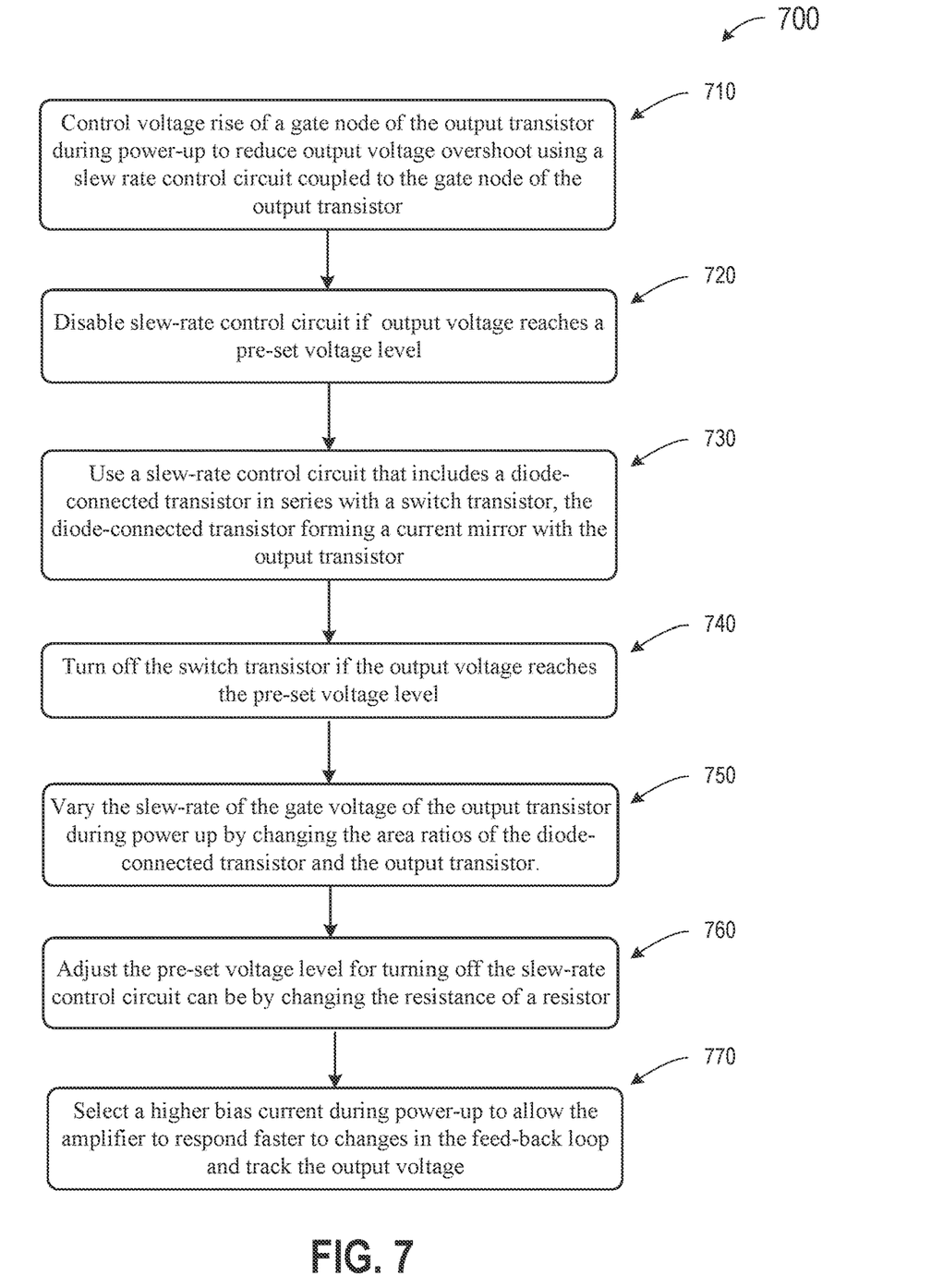
FIG. 7 is a simplified flowchart illustrating a method for reducing output voltage overshoot in an amplifier circuit according to some embodiments of the present invention.

FIG. 7 is a simplified flowchart illustrating a method for reducing output voltage overshoot in an amplifier circuit according to some embodiments of the present invention. As shown in FIG. 7, method 700 is a method for reducing output voltage overshoot in an amplifier circuit that includes an amplifier and an output transistor. The amplifier is coupled to an output node of the output transistor for providing an output voltage to a load device. Method 700 includes, at 710, controlling voltage rise of a gate node of the output transistor during power-up to reduce output voltage overshoot using a slew rate control circuit coupled to the gate node of the output transistor. Method 700 also includes, at 720, disabling the slew-rate control circuit if the output voltage reaches a pre-set voltage level. Method 700 also includes, at 730, using a slew-rate control circuit that includes a diode-connected transistor in series with a switch transistor, the diode-connected transistor forming a current mirror with the output transistor, and, at 740, turning off the switch transistor if the output voltage reaches the pre-set voltage level. At 750, the method can include varying the slew-rate of the gate voltage of the output transistor during power up by changing the area ratios of the diode-connected transistor and the output transistor. At 760, the pre-set voltage level for turning off the slew-rate control circuit can be adjusted by changing the resistance of a resistor coupled in series with a transistor in an output voltage detection circuit. Further, method 700 can also include, at 770, selecting a first bias current for the amplifier during power-up, and selecting a second bias current for the amplifier during normal operation. The first bias current is greater than the second bias current. By selecting the greater first bias current, the amplifier can respond faster to changes in the feed-back loop and track the output voltage.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Certain embodiments have been described. However, various modifications to these embodiments are possible, and the principles presented herein may be applied to other embodiments as well. In addition, the various components and/or method steps/blocks may be implemented in arrangements other than those specifically disclosed without departing from the scope of the claims. Other embodiments and modifications will occur readily to those of ordinary skill in the art in view of these teachings. Therefore, the following claims are intended to cover all such embodiments and modifications when viewed in conjunction with the above specification and accompanying drawings.

What is claimed is:

1. An amplifier circuit, comprising:
   a linear regulator having an amplifier and an output transistor forming a feedback loop, the amplifier configured for receiving a reference voltage and a feedback voltage from the feedback loop, and the output transistor having an output node for providing an output voltage to a load device; and
   a slew-rate control circuit coupled to a gate node of the output transistor and configured to control voltage rise of the gate node during power-up to reduce output voltage overshoot;
   wherein the amplifier circuit is configured to disable the slew control circuit when the output voltage reaches a pre-set voltage level, thus starting normal operation;
   wherein the amplifier circuit further comprises an amplifier bias current selection circuit configured to select:
   a first bias current for the amplifier during power-up; and
   a second bias current for the amplifier during normal operation, wherein the first bias current is lower than the second bias current.

2. The amplifier circuit of claim 1, wherein the slew-rate control circuit comprises a switch transistor and a diode-connected transistor, the gate node of the diode-connected transistor coupled to the gate node of the output transistor to form a current mirror, the diode-connected transistor having its gate node coupled to its drain node.

3. The amplifier circuit of claim 2, wherein the diode-connected transistor and the switch transistor are p-type metal-oxide-semiconductor (PMOS) transistors.

4. The amplifier circuit of claim 2, wherein the slew-rate is determined by a bias current in the diode-connected transistor and the size of the diode-connected transistor.

5. The amplifier circuit of claim 2, further comprising an output voltage level detection circuit coupled to the output node of the output transistor, the output voltage level detection circuit configured to turn off the switch transistor to disable the slew control circuit if the output voltage reaches a pre-set voltage level.

6. An amplifier circuit, comprising:
   a linear regulator having an amplifier and an output transistor forming a feedback loop, the amplifier configured for receiving a reference voltage and a feedback voltage from the feedback loop, and the output transistor having an output node for providing an output voltage to a load device; and
   a slew-rate control circuit coupled to a gate node of the output transistor and configured to control voltage rise of the gate node during power-up to reduce output voltage overshoot;
   wherein the slew-rate control circuit comprises a switch transistor and a diode-connected transistor, the gate node of the diode-connected transistor coupled to the gate node of the output transistor to form a current mirror, the diode-connected transistor having its gate node coupled to its drain node;
   wherein the amplifier circuit further comprises an output voltage level detection circuit coupled to the output node of the output transistor, the output voltage level detection circuit configured to turn off the switch transistor to disable the slew control circuit if the output voltage reaches a pre-set voltage level;
   wherein the output voltage level detection circuit comprises:
   a first current source, a first transistor, and a bias resistor coupled in series between a voltage supply and a ground node, a gate node of the first transistor coupled to the output node of the output transistor;
   a second transistor coupled between a source node of the first transistor and the ground node; and
   a third transistor having a gate node coupled to a drain node of the first transistor and a drain node coupled to the second transistor and a gate node of the switch transistor of the slew rate control circuit.

7. The amplifier circuit of claim 6, wherein the output voltage level detection circuit is configured to disable the slew rate control circuit if the output voltage reaches the pre-set voltage level, wherein the pre-set voltage level is determined based on the first current source, the bias resistor, and a threshold voltage of the first transistor.

8. The amplifier circuit of claim 6, wherein the first transistor, the second transistor, and the third transistor are n-type metal-oxide-semiconductor (NMOS) transistors.

9. An amplifier circuit, comprising:
an amplifier;
an output transistor, the amplifier coupled to an output node of the output transistor for providing an output voltage to a load device;
a slew-rate control circuit coupled to a gate node of the output transistor and configured to control voltage rise of the gate node of the output transistor during power-up to reduce output voltage overshoot; and
an output voltage level detection circuit configured to disable the slew control circuit when the output voltage reaches a pre-set voltage level;
wherein the slew-rate control circuit comprises a switch transistor and a diode-connected transistor, the gate node of the diode-connected transistor coupled to the gate node of the output transistor to form a current mirror, the diode-connected transistor having its gate node coupled to its drain node;
wherein the output voltage level detection circuit is coupled to the output node of the output transistor, the output voltage level detection circuit configured to turn off the switch transistor to disable the slew control circuit if the output voltage reaches the pre-set voltage level;
wherein the output voltage level detection circuit comprises:
a first current source, a first transistor, and a bias resistor couple in series between a voltage supply and a ground node, a gate node of the first transistor coupled to the output node of the output transistor;
a second transistor coupled between a source node of the first transistor and the ground node; and
a third transistor having a gate node coupled to a drain node of the first transistor and a drain node coupled to the second transistor and a gate of the switch transistor of the slew rate control circuit.

10. A method for reducing output voltage overshoot in an amplifier circuit, the amplifier circuit including an amplifier and an output transistor, the amplifier coupled to an output node of the output transistor for providing an output voltage to a load device, the method comprising:
controlling voltage rise of a gate node of the output transistor by coupling a slew-rate control circuit to the gate node during power-up, wherein the slew-rate control circuit includes a diode-connected transistor in series with a switch transistor, the diode-connected transistor forming a current mirror with the output transistor;
disabling the slew-rate control circuit by turning off the switch transistor, if the output voltage reaches a pre-set voltage level;
selecting a first bias current for the amplifier during power-up; and
selecting a second bias current for the amplifier during normal operation, wherein the slew-rate control circuit is disabled;
wherein the first bias current is lower than the second bias current.

* * * * *